(12) United States Patent
Lin et al.

(10) Patent No.: US 9,813,809 B1
(45) Date of Patent: Nov. 7, 2017

(54) MOBILE DEVICE AND METHOD FOR OPERATING THE SAME

(71) Applicant: Merry Electronics(Shenzhen) Co., Ltd., Guangdong (CN)

(72) Inventors: Hung-Chi Lin, Taichung (TW); Jen-Po Hsiao, Taichung (TW); Wen-Hong Wang, Taichung (TW)

(73) Assignee: Merry Electronics(Shenzhen) Co., Ltd., Guangdong (CN)

( * ) Notice: Subject to any disclaimer, the term of this patent is extended or adjusted under 35 U.S.C. 154(b) by 156 days.

(21) Appl. No.: 14/640,026

(22) Filed: Mar. 6, 2015

(30) Foreign Application Priority Data

Nov. 18, 2014 (TW) .............................. 103139897 A

(51) Int. Cl.
*H04B 1/00* (2006.01)
*H04R 3/00* (2006.01)
*H03G 3/20* (2006.01)

(52) U.S. Cl.
CPC ............... *H04R 3/005* (2013.01); *H03G 3/20* (2013.01)

(58) Field of Classification Search
CPC ................................................... H04R 1/1083
See application file for complete search history.

(56) References Cited

U.S. PATENT DOCUMENTS

2001/0046304 A1* 11/2001 Rast ...................... H04R 1/1041
381/74
2015/0358730 A1* 12/2015 Kirsch ................... H04R 3/002
381/71.1

* cited by examiner

*Primary Examiner* — Joseph Saunders, Jr.
(74) *Attorney, Agent, or Firm* — JCIPRNET

(57) ABSTRACT

A mobile device and a method for operating the same are provided. The mobile device includes a sound detection unit, a signal processing unit, a sound mixing unit and a speaker. The sound detection unit detects an environment sound around the mobile device and converts the environment sound to an external sound signal. The signal processing unit analyzes the external sound signal and determines whether to enable a sound mixed mode according to an analyzed result. In the sound mixed mode, the sound mixing unit mixes a music signal with the external sound signal to generate a sound mixed signal, and the mobile device plays the sound mixed signal through the speaker.

18 Claims, 7 Drawing Sheets

MOBILE DEVICE AND METHOD FOR OPERATING THE SAME

CROSS-REFERENCE TO RELATED APPLICATION

This application claims the priority benefit of Taiwan application serial no. 103139897, filed on Nov. 18, 2014. The entirety of the above-mentioned patent application is hereby incorporated by reference herein and made a part of this specification.

BACKGROUND OF THE INVENTION

1. Field of the Invention

The invention relates to a mobile device and a method for operating the same, and particularly relates to a mobile device having a speaker and a method for operating the same.

2. Description of Related Art

With the progress of technology and change of times, mobile devices are present everywhere in people's lives, and a variety of functions of the mobile devices also bring more convenience and entertainment to people. For instance, people often like to wear earphones to listen to music played by the mobile devices. However, under the circumstance of listening to music through earphones, users generally have difficulty hearing external sounds clearly. Thus, users need to manually turn off the music or unplug the earphone to be able to talk to people or notice sudden occurrences nearby, which reduces convenience and safety when using the mobile devices.

SUMMARY OF THE INVENTION

A mobile device and a method for operating the same are provided, which convert an environment sound to an external sound signal and use the external sound signal and a music signal to generate a sound mixed signal in a sound mixed mode. Thereby, the mobile device may selectively play the sound mixed signal through a speaker so as to enhance convenience and safety when using the mobile device.

The mobile device of the invention includes a sound detection unit, a signal processing unit, a sound mixing unit and a speaker. The sound detection unit detects the environment sound around the mobile device and converts the environment sound to the external sound signal. The signal processing unit analyzes the external sound signal and determines whether to enable the sound mixed mode according to an analyzed result. In the sound mixed mode, the sound mixing unit mixes the music signal with the external sound signal so as to generate the sound mixed signal, and the mobile device plays the sound mixed signal through the speaker.

The method for operating the mobile device of the invention includes the following steps. The music signal is received. The environment sound around the mobile device is detected, and the environment sound is converted to the external sound signal. The external sound signal is analyzed, and it is determined whether to enable a sound mixed mode according to an analyzed result. In the sound mixed mode, the music signal and the external sound signal are mixed to generate the sound mixed signal, and the sound mixed signal is played through the speaker in the mobile device.

Based on the above, the environment sound around the mobile device is converted to the external sound signal, and the external sound signal and the music signal are used to generate the sound mixed signal in the sound mixed mode. Thereby, the mobile device selectively plays the sound mixed signal through the speaker so as to enhance convenience and safety when using the mobile device.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
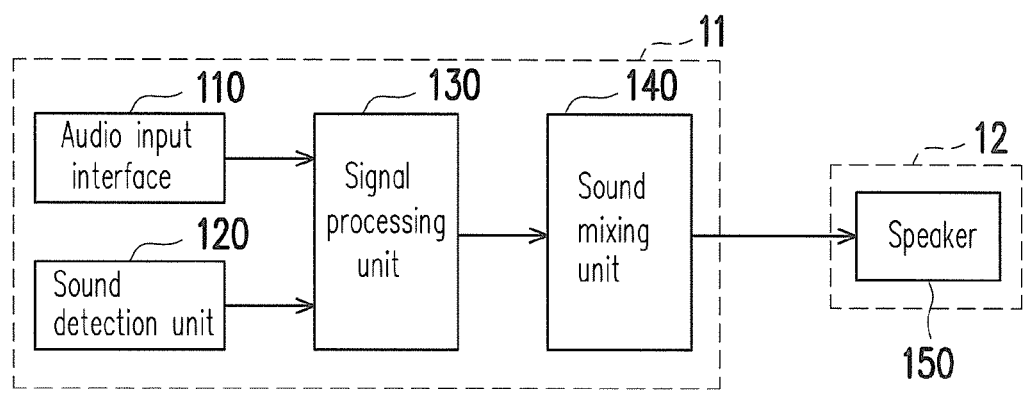
FIG. 1 is a schematic block diagram of a mobile device according to an embodiment of the invention.

FIG. 1 is a schematic block diagram of a mobile device according to an embodiment of the invention. As shown in FIG. 1, a mobile device 100 includes an audio input interface 110, a sound detection unit 120, a signal processing unit 130, a sound mixing unit 140 and a speaker 150. The mobile device 100 receives a music signal in digital format through the audio input interface 110 and plays the music signal through the speaker 150, so as to provide the user with enjoyment of audio/video entertainment.

In the process of playing the music signal, the mobile device 100 further detects an environment sound from sound sources around the mobile device 100 via the sound detection unit 120. In addition, the sound detection unit 120 converts the detected environment sound to an external sound signal. Furthermore, the signal processing unit 130 analyzes the external sound signal and determines whether to enable a sound mixed mode according to an analyzed result. When the sound mixed mode is enabled, the sound mixing unit 140 mixes the music signal with the external sound signal so as to generate a sound mixed signal, and the mobile device 100 plays the sound mixed signal through the speaker 150.

In other words, in the sound mixed mode, in addition to listening to music through the speaker 150, the user is further able to hear the environment sound nearby through the speaker 150. The environment sound around the mobile device 100 may be voices uttered by people. For example, talks, shouts and screams by people nearby or conversations from the phone. In other words, in the sound mixed mode, the user does not need to turn off the music manually to be able to talk to people, answer the phone or notice reactions of people nearby, so that convenience and safety when using the mobile device 100 is enhanced.

In addition, the environment sound around the mobile device 100 may also be, for example, prompt sounds for reminding or alerting the user, such as phone ring, broadcasting from a building, whistles from specialty vehicles (police cars, fire engines, ambulances, wreckers or the like), or engine sounds from public transportation (cars, motorcycles, buses or the like), the sounds of emergency breaks and car horns. In other words, in the sound mixed mode, while listening to music, the user is able to hear the prompt sounds nearby and thereby notice the instant condition or sudden occurrences, so that the convenience and safety when using the mobile device 100 is enhanced.

It should be noted that in an embodiment, the mobile device 100 further includes a device body 11 and an external module 12. The external module 12 is detachably connected to the device body 11. In addition, the audio input interface 110, the sound detection unit 120, the signal processing unit 130 and the sound mixing unit 140 are disposed in the device body 11, and the speaker 150 is disposed in the external module 12. Furthermore, the external module 12 may be, for example, an earphone, and the device body 11 may be, for example, a power bank, wherein the power bank provides power source or store power through a battery pack (not shown) therein. In addition, persons having ordinary skill in the art may also dispose the sound detection unit 120 in the external module 12 according to the needs of the design.

Figure 2:
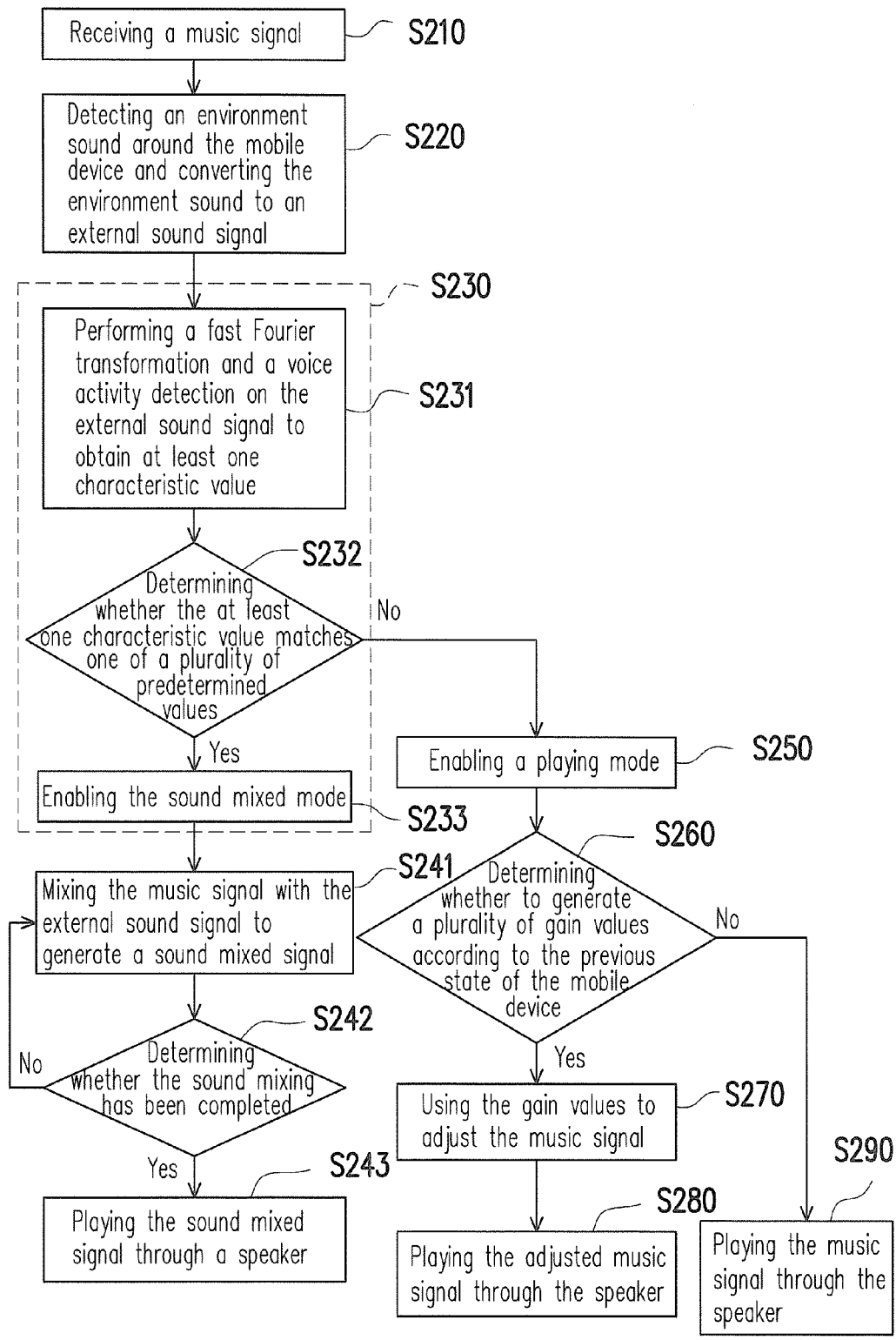
FIG. 2 is a flowchart of a method for operating the mobile device according to an embodiment of the invention.

For persons having ordinary skill in the art to better understand the invention, FIG. 2 is a flowchart of a method for operating a mobile device according to an embodiment of the invention. Referring to both FIGS. 1 and 2, the mobile device 100 is further described. As shown in step S210, the mobile device 100 receives the music signal in digital format through the audio input interface 110. On the other hand, as shown in step S220, the sound detection unit 120 detects the environment sound around the mobile device 100 and converts the detected environment sound to the external sound signal.

Furthermore, as shown in step S230, the signal processing unit 130 analyzes the external sound signal and determines whether to enable a sound mixed mode according to the analyzed result. In terms of the detailed steps of the step S230, as shown in step S231, the signal processing unit 130 performs a fast Fourier transformation (FFT) and a voice activity detection (VAD) on the external sound signal, so as to analyze the external sound signal and obtain at least one characteristic value. Thereby, the signal processing unit 130 determines whether the external sound signal is a voice signal or a prompt signal for reminding or alerting the user according to the obtained at least one characteristic value.

More specifically, as shown in step S232, the signal processing unit 130 compares the obtained at least one characteristic value with a plurality of predetermined values. When the obtained at least one characteristic value matches one of the plurality of predetermined values, the signal processing unit 130 distinguishes the external sound signal is a voice signal or a prompt signal. At this point, as shown in step S233, the signal processing unit 130 enables the sound mixed mode. On the other hand, when the obtained at least one characteristic value does not match the plurality of predetermined values, the signal processing unit 130 does not enable the sound mixed mode.

For instance, in distinguishing voice signals, the signal processing unit 130 obtains the characteristic value (such as a voice characteristic value) in the external sound signal through the VAD, and compares the obtained characteristic value with a predetermined value (such as a voice sample value) stored therein, so as to distinguish whether the external voice signal is a voice signal. In addition, human voices usually have fixed periods and are mostly concentrated in low and medium frequency bands (i.e. voice bands). Therefore, in another embodiment, the signal processing unit 130 may also obtain the characteristic value (such as a frequency value) of the external sound signal through the FFT and compare the obtained characteristic value with the predetermined value (such as a voice frequency value) stored in the signal processing unit 130, so as to distinguish whether the external sound signal is in the voice band and thereby to distinguish whether the external sound signal is a voice signal.

On the other hand, since the prompt sound normally has a relatively higher frequency, the frequency of the prompt sound may also be defined in a prompt band. If the external sound signal generated by the sound detection unit 120 is in the prompt band, the environment sound detected by the sound detection unit 120 is a prompt sound, and the external sound signal generated is a prompt signal. Therefore, in distinguishing the prompt signal, the signal processing unit 130 is also able to obtain the characteristic value (such as the frequency value) of the external sound signal through the FFT and compare the obtained characteristic value with the predetermined value (such as a prompt frequency value) stored therein, so as to distinguish whether the external sound signal is in the prompt band and thereby distinguish whether the external sound signal is a prompt signal.

Referring to FIGS. 1 and 2 again, in the sound mixed mode, as shown in step S241, the sound mixing unit 140 mixes the music signal with the external sound signal to generate the sound mixed signal accordingly. In addition, as shown in step S242, the sound mixing unit 140 determines whether the mixing process of the music signal and the external sound signal has been completed. When the mixing process is completed, as shown in step S243, the sound mixing unit 140 outputs the sound mixed signal, and the mobile device 100 plays the sound mixed signal through the speaker 150. Thereby, the user is able to hear both the music and the voice or prompt sound in the near environment through the speaker 150, which thereby effectively enhances convenience and safety when using the mobile device 100.

On the other hand, the signal processing unit 130 may also determine whether to enable a playing mode according to the analyzed result. For instance, when none of the at least one characteristic value obtained by the signal processing unit 130 satisfies the plurality of predetermined values, namely, when the sound mixed mode is not enabled, as shown in step S250, the signal processing unit 130 enables the playing mode. In the playing mode, as shown in step S260, the sound mixing unit 140 determines whether to generate a plurality of gain values according to the previous state of the mobile device 100.

For instance, if the previous state of the mobile device 100 is the sound mixed mode, it means that the mobile device 100 is switched from the sound mixed mode to the playing mode. Therefore, under the control of the signal processing unit 130, the sound mixing unit 140 generates the plurality of gain values. In addition, as shown in step S270, the sound mixing unit 140 uses the plurality of gain values to adjust the music signal. For example, the sound mixing unit 140 may use the plurality of gain values to gradually increase the volume of the music signal. Furthermore, as shown in step S280, the mobile device 100 plays the adjusted music signal through the speaker 150.

In other words, when the mobile device 100 is switched from the sound mixed mode to the playing mode, the speaker 150 plays the music signal progressively, so that the user is adapted to the switch between the modes of the mobile device 100, preventing from discomfort due to a sudden rise in the volume of the music signal. It is worth mentioning that the volume of the music signal may increase from a first volume to a second volume through the plurality of gain values of the sound mixing unit 140. The second volume may be, for example, a predetermined volume or an original volume of the music signal without the sound mixing process. For instance, in an embodiment, the signal processing unit 130 detects the original volume of the music signal before enabling the sound mixed mode and set the detected original volume as the second volume. Afterwards, when the mobile device 100 is switched from the sound mixed mode to the playing mode, the mobile device 100 adjusts the volume of the music signal to the original volume progressively, so that the mobile device 100 resumes the playing conditions previously configured by the user.

On the other hand, when the previous state of the mobile device 100 is the playing mode, it means that the mobile device 100 has remained in the playing mode. Therefore, under the control of the signal processing unit 130, the sound mixing unit 140 does not generate the plurality of gain values. In addition, as shown in step S290, the sound mixing unit 140 may transmit the music signal directly, so that the mobile device 100 plays the music signal through the speaker 150. In other words, when the mobile device 100 stays in the playing mode continuously, the music signal is transmitted to the speaker 150 through the signal processing unit 130 and the sound mixing unit 140, so that the mobile device 100 plays the music signal through the speaker 150 continuously.

Figure 3:
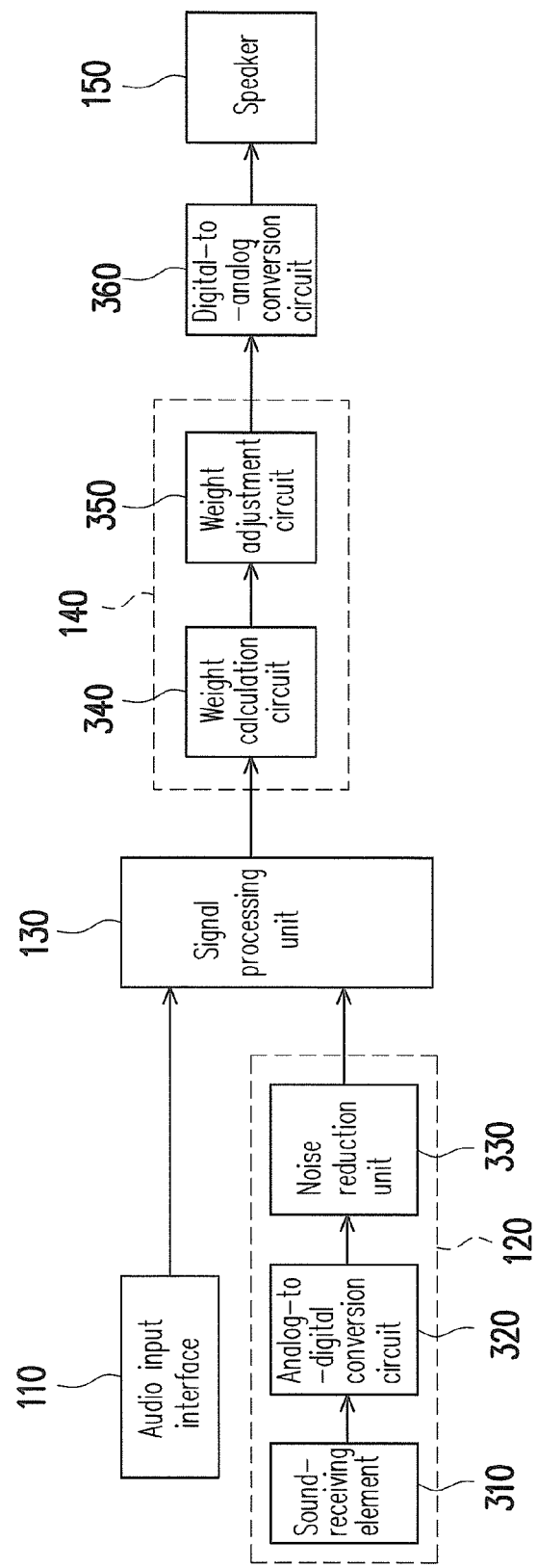
FIG. 3 is a schematic block diagram of a mobile device according to another embodiment of the invention.
Figure 4:
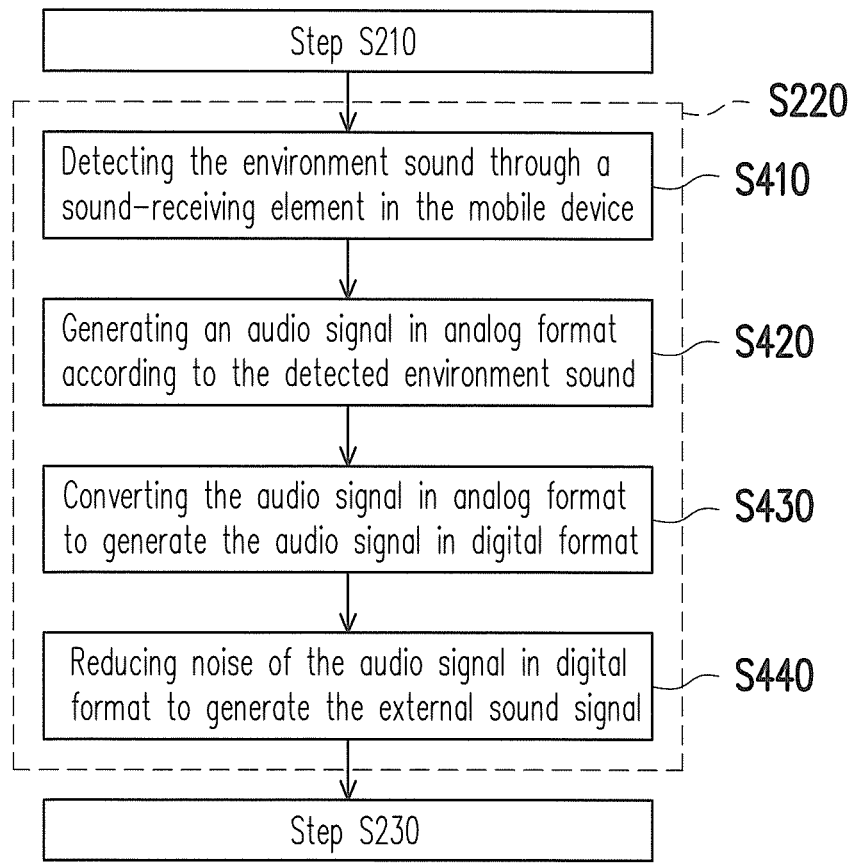
FIG. 4 is a detailed flowchart for describing a step S220 according to an embodiment of the invention.

FIG. 3 is a schematic block diagram of a mobile device according to another embodiment of the invention. As shown in FIG. 3, in an embodiment, the sound detection unit 120 includes a sound-receiving element 310, an analog-to-digital conversion circuit 320 and a noise reduction unit 330. The sound mixing unit 140 includes a weight calculation circuit 340 and a weight adjustment circuit 350. In addition, FIG. 4 is a detailed flowchart for describing the step S220 according to an embodiment of the invention. Reference is made to both FIGS. 3 and 4 for the detailed operations of the sound detection unit 120.

As shown in steps S410 and S420, the sound-receiving element 310 detects an environment sound around the mobile device 100 and generates an audio signal in analog format according to the detected environment sound. The sound-receiving element 310 may be, for example, a microphone. In addition, as shown in step S430, the analog-to-digital conversion circuit 320 converts the audio signal in analog format and generates the audio signal in digital format accordingly. In addition, as shown in step S440, the noise reduction unit 330 reduces noise (such as low-frequency noise or white noise) in the audio signal in digital format to generate the external sound signal. The noise reduction unit 330 reduces low-frequency noise having a frequency range between 20-200 Hz and other noise by using noise reduction algorithm. The low-frequency noise includes noises generated by, for example, a fan motor, an electric generator and a cooling tower.

Figure 5:
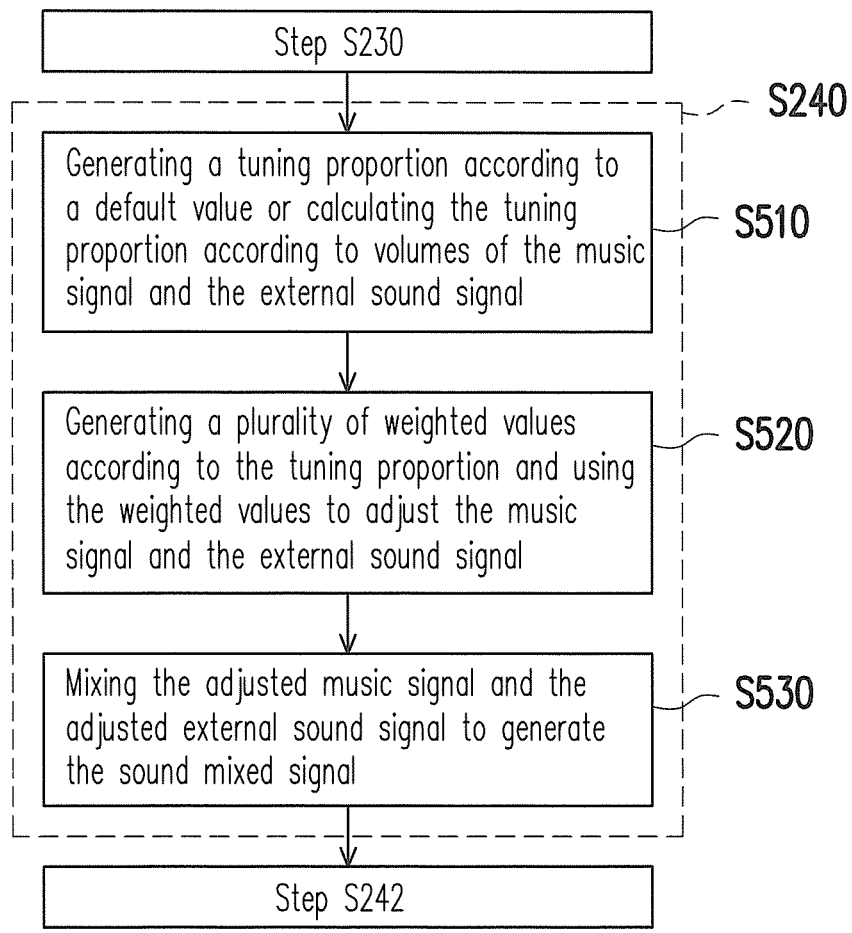
FIG. 5 is a detailed flowchart for describing a step S241 according to an embodiment of the invention.

FIG. 5 is a detailed flowchart for explaining a step S241 according to an embodiment of the invention. Referring to both FIGS. 3 and 5, below are detailed operations of the sound mixing unit 140. As shown in step S510, in the sound mixed mode, the weight calculation circuit 340 generates a tuning proportion according to a default value or calculates the tuning proportion according to volumes of the music signal and the external sound signal. In addition, as shown in step S520, the weight adjustment circuit 350 generates a plurality of weighted values according to the tuning proportion and uses the plurality of weighted values to adjust the music signal and the external sound signal. In addition, as shown in step S530, the weight adjustment circuit 350 mixes the adjusted music signal and the adjusted external sound signal to generate the sound mixed signal.

Figure 6:
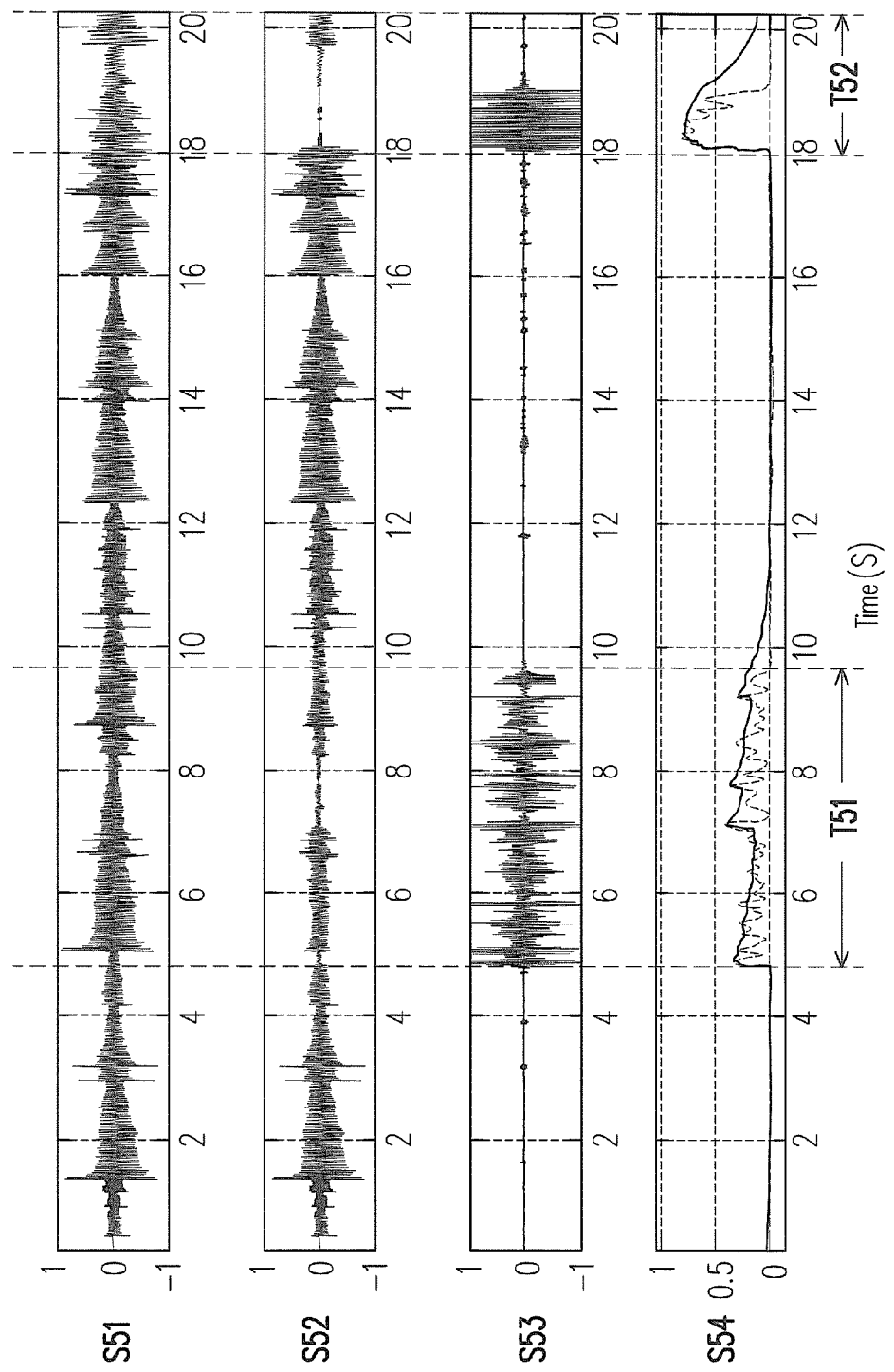
FIG. 6 is a schematic waveform diagram of a mobile device according to an embodiment of the invention.

For instance, FIG. 6 is a schematic waveform diagram of a mobile device according to an embodiment of the invention, wherein S51 represents the music signal, S52 represents the music signal after being adjusted according to the weighted value, S53 represents the external sound signal, and S54 represents an energy intensity of the external sound signal. As shown in FIG. 6, in time periods T51 and T52, the sound detection unit 120 generates the external sound signal S53 in response to the environment sound, and the signal processing unit 130 identifies the external sound signal S53 as a voice signal so as to enable the sound mixed mode.

In addition, in terms of the energy intensity S54 of the external sound signal, the external sound signal S53 within the time period T51 is smaller than the external sound signal S53 within the time period T52. In other words, the external sound signal S53 within the time period T51 may be, for example, a smaller sound of talk in the environment, while the external sound signal S53 within the time period T52 may be, for example, be a larger sound of talk in the environment. On the other hand, in terms of the adjusted music signal S52, in the sound mixed mode, the weight calculation circuit 340 uses a weighted value to decrease the amplitude of the music signal S51 within the time period T51 in a small range, while the weight calculation circuit 340 uses another weighted value to decrease the amplitude of the music signal S51 within the time period T52 in a wide range. In addition, the weight calculation circuit 340 adds the adjusted music signal S52 to the external sound signal S53 to generate the sound mixed signal.

In other words, when the sound detection unit 120 detects the smaller sound of talk in the environment, the sound mixing unit 140 adequately decreases the volume of the music signal S52 and adds the decreased music signal S52 to the external sound signal S53, so that the user is able to hear the music and the sound of talk in the external through the speaker 150. In comparison, when the sound detection unit 120 detects the larger sound of talk in the environment, the sound mixing unit 140 greatly decreases the volume of the music signal S52, so that the sound that the user hears through the speaker 150 is mostly the sound of talk in the external.

Figure 7:
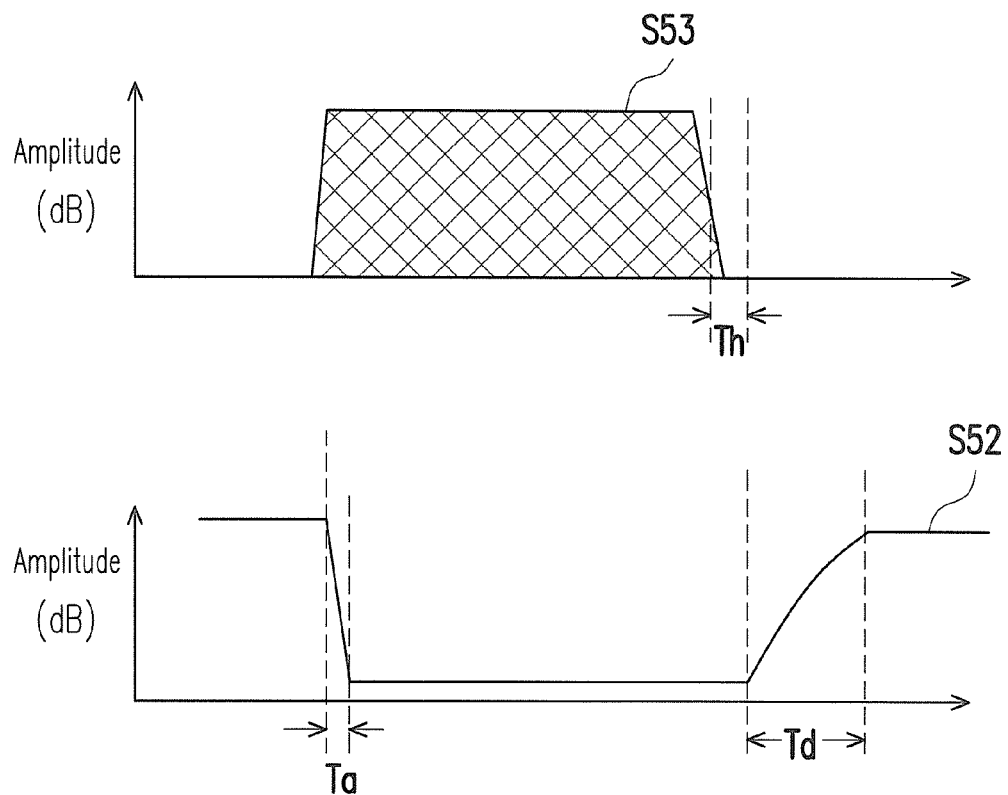
FIG. 7 is a schematic waveform diagram of a mobile device according to another embodiment of the invention.

It is worth mentioning that FIG. 7 is a schematic waveform diagram of a mobile device according to another embodiment of the invention. As shown in FIG. 7, when the external sound signal S53 is received, the sound mixing unit 140 rapidly decreases the amplitude of the music signal S52 within an attack time Ta. The attack time Ta is a time required for the sound mixing unit 140 to adjust the music signal. In addition, when the external sound signal S53 is no longer generated, the mobile device 100 enables the playing mode after a hold time Th, so as to confirm whether the sound detection unit 120 detects other environment sounds. In addition, when the mobile device 100 switches from the sound mixed mode to the playing mode, the mobile device 100 uses the plurality of gain values to gradually increase the music signal within a decay time Td, so that the music signal is gradually adjusted to the original volume.

Furthermore, the sound mixing unit 140 of FIG. 3 is for generating the sound mixed signal in digital format. Therefore, in the embodiment of FIG. 3, the mobile device 100 further includes a digital-to-analog conversion circuit 360. The digital-to-analog conversion circuit 360 is for converting the sound mixed signal or music signal in digital format, so as to generate the sound mixed signal or music signal in analog format. In addition, the mobile device 100 uses the sound mixed signal or music signal in analog format to drive the speaker 150. It should be noted that in another embodiment, the analog-to-digital conversion circuit 360 may also be disposed in the sound mixed unit 140, so that the sound mixed unit 140 directly generates the sound mixed signal or music signal in digital format for driving the speaker 150.

In view of the above, the mobile device of the invention uses the sound detection unit to convert the environment sound around the mobile device to the external sound signal and mixes the music signal with the external sound signal in the sound mixed mode to generate the sound mixed signal accordingly. Thereby, the mobile device selectively plays the music signal or the sound mixed signal through the speaker, so that the user may notice the instant condition or sudden occurrences nearby while listening to music, which thereby enhances the convenience and safety when using the mobile device.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A mobile device, comprising:
   a sound detection unit, detecting an environment sound around the mobile device and converting the environment sound to an external sound signal;
   a signal processing unit, analyzing the external sound signal and determining whether to enable a sound mixed mode or a playing mode according to an analyzed result;
   a sound mixing unit, mixing a music signal with the external sound signal in the sound mixed mode to generate a sound mixed signal; and
   a speaker, wherein the mobile device plays the sound mixed signal through the speaker in the sound mixed mode,
   wherein when the signal processing unit determines to enable the sound mixed mode according to the analyzed result, the sound mixing unit uses a plurality of weighted values to adjust the music signal and the external sound signal, and to generate the sound mixed signal,
   wherein when the signal processing unit determines to enable the playing mode according to the analyzed result in the sound mixed mode, the signal processing unit generates a plurality of gain values, the sound mixing unit uses the gain values to adjust the music signal, and the mobile device plays the adjusted music signal through the speaker.

2. The mobile device according to claim 1, wherein the sound mixing unit increases a volume of the music signal to an original volume according to the gain values.

3. The mobile device according to claim 1, wherein in the sound mixed mode, the sound mixing unit decreases the amplitude of the music signal within an attack time.

4. The mobile device according to claim 1, wherein the sound detection unit comprises:
   a sound-receiving element, detecting the environment sound and generating an audio signal in analog format according to the detected environment sound;
   an analog-to-digital conversion circuit, converting the audio signal in analog format to generate the audio signal in digital format; and
   a noise reduction unit, reducing noise of the audio signal in digital format to generate the external sound signal.

5. The mobile device according to claim 1, wherein the sound mixing unit comprises:
   a weight calculation circuit, generating a tuning proportion according to a default value or calculating the tuning proportion according to volumes of the music signal and the external sound signal in the sound mixed mode; and
   a weight adjustment circuit, generating the weighted values according to the tuning proportion and using the weighted values to adjust the music signal and the external sound signal, wherein the weight adjustment circuit mixes the adjusted music signal and the adjusted external sound signal to generate the sound mixed signal.

6. The mobile device according to claim 1, wherein the signal processing unit performs a fast Fourier transformation and a voice activity detection on the external sound signal to obtain at least one characteristic value, the signal processing unit enables the sound mixed mode when the at least one characteristic value matches one of a plurality of predetermined values, and the signal processing unit enables the playing mode and determines whether to generate the gain values according to the previous state of the mobile device when the at least one characteristic value fails to match the predetermined values.

7. The mobile device according to claim 6, wherein the sound mixing unit uses the gain values to adjust the music signal and the mobile device plays the adjusted music signal through the speaker when the gain values are generated, and the sound mixing unit transmits the music signal so that the mobile device plays the music signal through the speaker when the gain values are not generated.

8. The mobile device according to claim 1, wherein the mobile device receives the music signal in digital format through an audio input interface.

9. The mobile device according to claim 8, wherein the sound mixing unit generates the sound mixed signal in digital format, and the mobile device further comprises:
   a digital-to-analog conversion circuit, converting the sound mixed signal or the music signal in digital format to generate the sound mixed signal or the music signal in analog format, wherein the mobile device uses the sound mixed signal or the music signal in analog format to drive the speaker.

10. The mobile device according to claim 1, wherein the mobile device further comprises a device body and an external module, the external module being detachably connected to the device body, the signal processing unit and the sound mixing unit are disposed in the device body, the speaker is disposed in the external module, and the sound detection unit is disposed in the device body or the external module.

11. The mobile device according to claim 10, wherein the device body is a power bank, and the external module is an earphone.

12. A method for operating a mobile device, comprising:
receiving a music signal;
detecting an environment sound around the mobile device and converting the environment sound to an external sound signal; and
analyzing the external sound signal and determining whether to enable a sound mixed mode or a playing mode according to an analyzed result;
wherein when the sound mixed mode is determined to be enabled according to the analyzed result, the method further comprises:
using a plurality of weighted values to adjust the music signal and the external sound signal, so as to decrease the amplitude of the music signal and increase the amplitude of the external sound signal;
adding the adjusted music signal to the adjusted external sound signal so as to generate the sound mixed signal; and
playing the sound mixed signal through a speaker in the mobile device,
wherein when the playing mode is determined to be enabled according to the analyzed result when the mobile device is in the sound mixed mode, the method further comprises:
enabling a playing mode and generating a plurality of gain values;
using the gain values to adjust the music signal and playing the adjusted music signal through the speaker.

13. The method for operating the mobile device according to claim 12, wherein the step of detecting the environment sound around the mobile device and converting the environment sound to the external sound signal comprises:
detecting the environment sound through a sound-receiving element in the mobile device;
generating an audio signal in analog format according to the detected environment sound;
converting the audio signal in analog format to generate the audio signal in digital format; and
reducing noise of the audio signal in digital format to generate the external sound signal.

14. The method for operating the mobile device according to claim 12, wherein the step of analyzing the external sound signal and determining whether to enable the sound mixed mode according to the analyzed result comprises:
performing a fast Fourier transformation and a voice activity detection on the external sound signal to obtain at least one characteristic value; and
enabling the sound mixed mode when the at least one characteristic value matches one of a plurality of predetermined values.

15. The method for operating the mobile device according to claim 12, wherein the sound mixed signal is in digital format, and the step of playing the sound mixed signal through the speaker in the mobile device comprises:
converting the sound mixed signal in digital format to generate the sound mixed signal in analog format; and
using the sound mixed signal in analog format to drive the speaker.

16. The method for operating the mobile device according to claim 12, wherein when the sound mixed mode is determined to be enabled according to the analyzed result, the method further comprises:
generating a tuning proportion according to a default value or calculating the tuning proportion according to volumes of the music signal and the external sound signal;
generating the weighted values according to the tuning proportion and using the weighted values to adjust the music signal and the external sound signal; and
mixing the adjusted music signal and the adjusted external sound signal to generate the sound mixed signal.

17. The method for operating the mobile device according to claim 16, wherein the step of using the weighted values to adjust the music signal and the external sound signal comprises:
decreasing the amplitude of the music signal according to the weighted values; and
increasing the amplitude of the external sound signal according to the weighted values.

18. A mobile device, comprising:
a sound detection unit, detecting an environment sound around the mobile device and converting the environment sound to an external sound signal;
a signal processing unit, analyzing the external sound signal and determining whether to enable a sound mixed mode or a playing mode according to an analyzed result;
a sound mixing unit, mixing a music signal with the external sound signal in the sound mixed mode to generate a sound mixed signal; and
a speaker, wherein the mobile device plays the sound mixed signal through the speaker in the sound mixed mode,
wherein when the mobile device is determined to be switched from the sound mixed mode to the playing mode according to the analyzed result, the sound mixing unit generates a plurality of gain values, and uses the gain values to increase a volume of the music signal to an original volume.

* * * * *